United States Patent
Tzadok et al.

(10) Patent No.: US 12,047,084 B1
(45) Date of Patent: Jul. 23, 2024

(54) PHASE ESTIMATION FOR HIGH FREQUENCY SIGNALS

(71) Applicant: International Business Machines Corporation, Armonk, NY (US)

(72) Inventors: Asaf Tzadok, New Castle, NY (US); Alberto Valdes Garcia, Chappaqua, NY (US); John Francis Bulzacchelli, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/092,177

(22) Filed: Dec. 30, 2022

(51) Int. Cl.
*H03L 7/191* (2006.01)
*G06F 17/15* (2006.01)
*H03L 7/107* (2006.01)

(52) U.S. Cl.
CPC .......... *H03L 7/191* (2013.01); *G06F 17/156* (2013.01); *H03L 7/107* (2013.01)

(58) Field of Classification Search
CPC . H03L 7/191; H03L 7/107; H03L 7/18; H03L 7/099; H03L 7/23; H03L 7/087; H03L 7/1976; H03L 7/093; H03L 7/16; H03L 7/183; H03L 7/0891; H03L 2207/06; H03L 7/0992; H03L 7/185; H03L 7/1974; H03L 2207/50; H03L 7/08; H03L 7/193; H03L 7/085; H03L 7/00; H03L 7/103; H03L 7/091; H03L 7/104; H03L 7/22; H03L 7/07; H03L 7/10; H03L 2207/12; H03L 7/0995; H03L 7/235; H03L 7/081; H03L 7/095; H03L 7/1075; H03L 7/06; H03L 7/113; H03L 7/197; H03L 7/24; H03L 7/0805; H03L 7/0807; H03L 7/1072; H03L 7/14; H03L 7/189; H03L 7/1806;

(Continued)

(56) References Cited

U.S. PATENT DOCUMENTS 5,157,341 A   10/1992   Fobbester
10,495,727 B2  12/2019  Gunn
(Continued)

FOREIGN PATENT DOCUMENTS

WO   WO-2020175986 A1 * 9/2020 ............... G01K 7/32

OTHER PUBLICATIONS

Peter Mell and Timothy Grance, The NIST Definition of Cloud Computing, NIST Special Publication 800-145, Sep. 2011, cover, pages i-iii and 1-3.

(Continued)

*Primary Examiner* — John W Poos
(74) *Attorney, Agent, or Firm* — Daniel Morris; Otterstedt & Kammer PLLC

(57) ABSTRACT

A first 1:N frequency divider has an input configured to be coupled to one of two signals and a second 1:N frequency divider has an input configured to be coupled to another of the two signals. A mixer includes two inputs, where each input is coupled to an output of one of the first and second 1:N frequency dividers. A low-pass filter has an input coupled to an output of the mixer and an analog-to-digital converter (ADC) has an input coupled to an output of the low-pass filter. A data collection and analysis block repeatedly changes a phase of an output of the first 1:N divider, collects a set of digitized data generated by the ADC, and estimates the phase difference between the two signals based on the set of digitized data.

18 Claims, 11 Drawing Sheets

(58) Field of Classification Search
CPC ..... H03L 1/027; H03L 7/0898; H03L 7/0812;
H03L 7/0994; H03L 1/026; H03L 7/0802;
H03L 7/0893; H03L 1/02; H03L 1/023;
H03L 7/0816; H03L 7/0895; H03L
7/0991; H03L 7/0814; H03L 7/0896;
H03L 7/199; H03L 7/101; H03L 7/187;
H03L 2207/10; H03L 7/089; H03L 7/143;
H03L 7/1978; H03L 1/022; H03L 7/083;
H03L 7/0997; H03L 7/0998; H03L
7/1077; H03L 1/00; H03L 7/0996; H03L
7/145; H03L 7/146; H03L 7/148; H03L
7/02; H03L 2207/08; H03L 7/0993; H03L
1/028; H03L 2207/18; H03L 5/00; H03L
7/12; H03L 2207/05; H03L 7/181; H03L
7/20; H03L 1/025; H03L 1/04; H03L
5/02; H03L 7/04; H03L 7/0818; H03L
7/097; H03L 7/141; G06F 17/156
See application file for complete search history.

(56) References Cited

U.S. PATENT DOCUMENTS

| | | | |
|---|---|---|---|
| 10,873,335 | B2 | 12/2020 | Marcu |
| 10,931,498 | B1 | 2/2021 | Dorosenco |
| 11,038,521 | B1 | 6/2021 | Rafi |
| 11,264,995 | B1 | 3/2022 | Chao |
| 11,296,710 | B2 | 4/2022 | Roodnat |
| 2002/0084856 | A1* | 7/2002 | Von Dolteren, Jr. ..... H03L 7/16 331/1 A |
| 2006/0025096 | A1* | 2/2006 | Jaffe .................... H04B 1/0039 455/260 |
| 2006/0279363 | A1* | 12/2006 | Shirasu .................. H03L 7/191 331/16 |
| 2011/0188601 | A1* | 8/2011 | Ko .......................... H03L 7/23 375/295 |
| 2020/0177194 | A1 | 6/2020 | Aouini |
| 2022/0021394 | A1 | 1/2022 | Xu |

OTHER PUBLICATIONS

Ching-Yuan Yang. A High-Frequency CMOS Multi-Modulus Divider For PLL Frequency Synthesizers. Analog Integr Circ Sig Process (2008) 55:155-162.

Yun-Peng Lyu et al. A New Design of Filtering Power Dividers With Arbitrary Constant Phase Difference, Impedance Transformation, and Good Isolation. IEEE Access, Nov. 22, 2019, pp. 13.

Yao Wang et al. A Programmable Frequency Divider With a Full Modulus Range and 50% Output Duty Cycle. Jun. 1, 2020, pp. 8.

Nasrin Rezaei-Hosseinabadi et al. A Wideband Frequency Divider With Programmable Odd/Even Division Factors and Quadrature/Symmetrical Outputs. 2020 IEEE, pp. 10.

Sleiman Bou Sleiman et al. Wide-Division-Range High-Speed Fully Programmable Frequency Divider. 2008 IEEE, pp. 4.

Dudek P, Szczepanski S, Hatfield Jv. A high-resolution CMOS time-to-digital converter utilizing a Vernier delay line. IEEE Journal of Solid-State Circuits. Feb. 2000;35(2):240-7.

Lu SJ, Siqueira P, Vijayendra V, Chandrikakutty H, Tessier R. Real-time differential signal phase estimation for space-based systems using FPGAs. IEEE Transactions on Aerospace and Electronic Systems. Apr. 5, 2013;49(2):1192-209.

Wikimedia Foundation. K-means clustering. Wikipedia. Retrieved via Wayback Machine for Dec. 23, 2022 for https://en.wikipedia.org/wiki/K-means_clustering (pp. 1-18.).

Wikimedia Foundation. Curve fitting. Wikipedia. Retrieved via Wayback Machine for Dec. 4, 2022 for https://en.wikipedia.org/wiki/Curve_fitting (pp. 1-7.).

Geng, Z. (2020). Robustness issues of timing and synchronization for free electron lasers. Nuclear Instruments and Methods in Physics Research Section A: Accelerators, Spectrometers, Detectors and Associated Equipment, 963, 163738. https://doi.org/10.1016/j.nima.2020.163738 (pp. 1-8.).

* cited by examiner

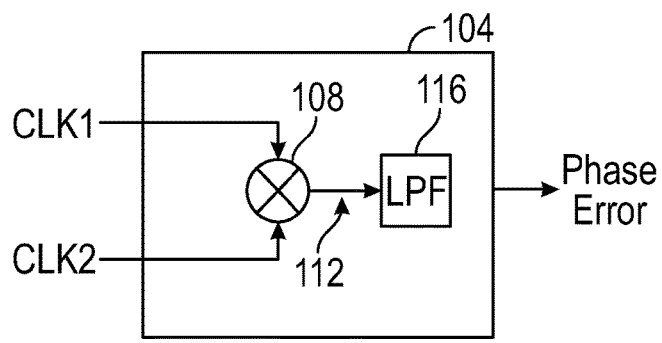
FIG. 1
*(Prior Art)*
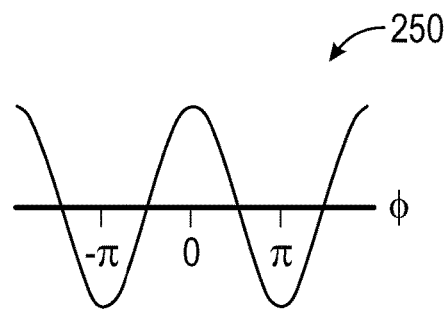
FIG. 2
*(Prior Art)*
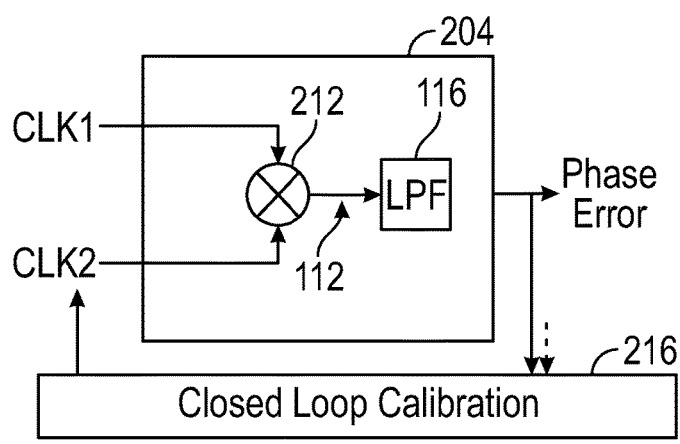
FIG. 3
*(Prior Art)*
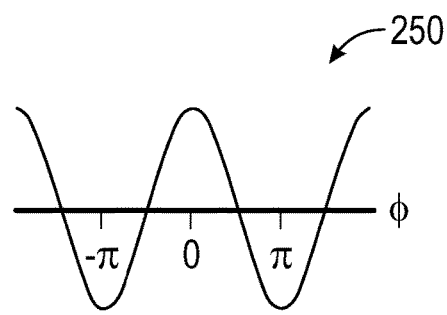

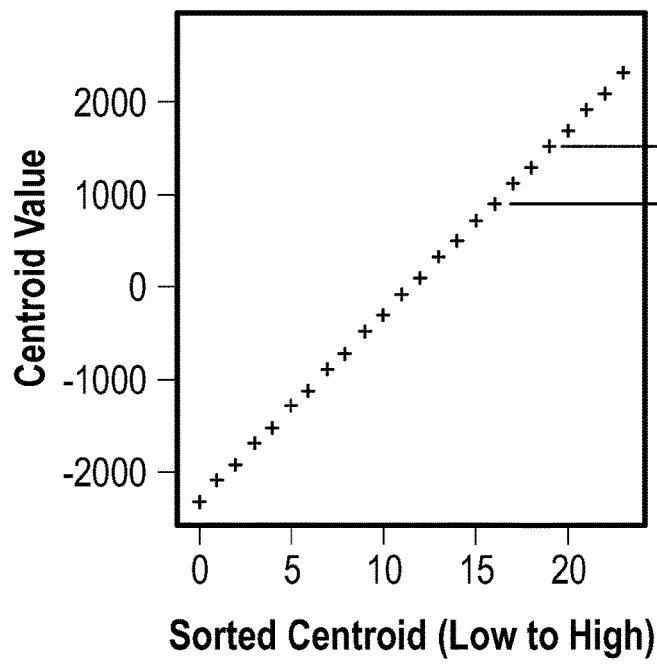 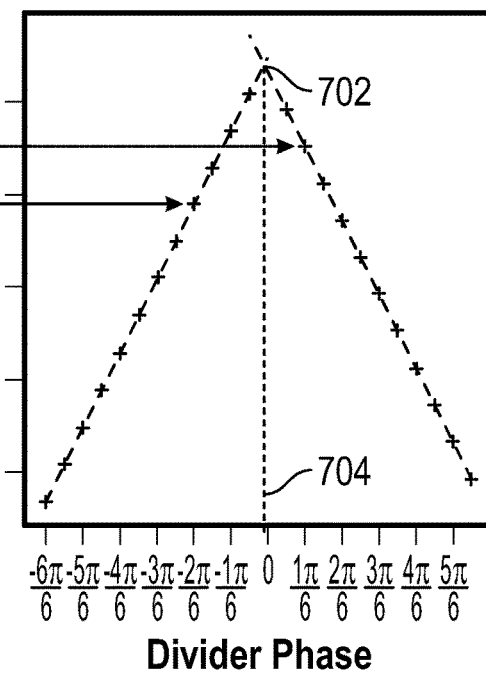
*FIG. 7A*  *FIG. 7B*

PHASE ESTIMATION FOR HIGH FREQUENCY SIGNALS

BACKGROUND

The present invention relates generally to the electrical, electronic and computer arts and, more particularly, to electronic circuits and systems.

Radio frequency (RF) systems use multiple high-speed integrated circuits (ICs) for many applications. The ICs are often implemented using multiple phase-locked loop (PLL) clocks, digital-to-analog converters (DACs), direct digital synthesizers (DDSs), and the like. In many cases, there is a need to synchronize these ICs (or circuits within the ICs); for example, by having their internal clocks synchronized to a common timing reference. Moreover, in many cases, it is not sufficient to have the clocks or the high frequency generated signals locked just in frequency; it is also required that they have a specific phase relationship. Controlling and estimating the phase difference between two signals becomes more difficult as the frequency of operation increases.

Frequency dividers are common building blocks in high-frequency signal generation and control systems. It is noted that, when a frequency divider with a division factor of N takes a signal with frequency f at its input, the output frequency is f/N and the phase of the output is based on one of N possible equally-distant values. In some divider implementations, the output phase changes randomly every time the divider gets disabled and re-enabled, either by turning the power on and off or by disconnecting and re-connecting the input signal. In other divider implementations, the output phase is deterministic and can be programmed electronically.

BRIEF SUMMARY

Principles of the invention provide techniques for phase estimation for high frequency signals. In one aspect, a system for estimating a phase difference between two signals comprises a first 1:N frequency divider, an input of the first 1:N frequency divider configured to be coupled to one of the two signals; a second 1:N frequency divider, an input of the second 1:N frequency divider configured to be coupled to another of the two signals; a mixer comprising two inputs, each input coupled to an output of one of the first and second 1:N frequency dividers; a low-pass filter (LPF), an input of the low-pass filter coupled to an output of the mixer; an analog-to-digital converter (ADC), an input of the analog-to-digital converter coupled to an output of the low-pass filter; a data collection and analysis block that repeatedly changes a phase of an output of the first 1:N divider and collects a set of digitized data generated by the ADC and that estimates the phase difference between the two signals based on the set of digitized data.

In one aspect, a method comprises, for M iterations, toggling a phase control signal impacting an output of a given one of a plurality of 1:N dividers and collecting, from an analog-to-digital converter, a direct current value derived from a multiplication of the outputs of the plurality of 1:N dividers; generating a sorted set of the collected direct current values by clustering the direct current values into N centroids using a clustering algorithm; deinterleaving sampling to two vectors; concatenating the two vectors; and flipping one of the two vectors.

In one aspect, a method for performing phase estimation comprises obtaining a sorted set of collected direct current values generated from a plurality of relative phases between outputs of two 1:N frequency dividers; and estimating a phase difference between two source signals for the 1:N frequency dividers.

As used herein, "facilitating" an action includes performing the action, making the action easier, helping to carry the action out, or causing the action to be performed. Thus, by way of example and not limitation, instructions executing on a processor might facilitate an action carried out by another processor, by semiconductor fabrication equipment, etc., by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

a solution for estimating the phase difference between high frequency signals where existing solutions are difficult or impossible to implement (such as if the PLLs are inside a mmWave (the band of spectrum between 30 GHz and 300 GHz) phased array);

beneficial to, for example, dual-DAC applications where there is a requirement for accepting separate data inputs that are synchronized with clocks that are not synchronized in phase;

accurate phase estimation without the need for shifting the phase of a clock;

no requirement for sampling or mixing the high-frequency output;

no requirement for changing locked clocks;

performs phase estimation as a background task;

implementation using low frequency commercial off-the-shelf (COTS) RF components;

enables phase estimation and signal estimation for COTS ICs; and a solution based on a programmable divider that requires a small number of measurements.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1 illustrates the theoretical principle of a conventional system for mixer-based phase estimation;

FIG. 2 is a graph that shows an expected amplitude for a range of values of the phase difference $\phi$ under ideal conditions;

FIG. 3 illustrates the theoretical principle of a conventional system for mixer-based phase synchronization with closed loop calibration;

FIG. 7A illustrates a graph of centroid values vs. a centroid index, in accordance with an example embodiment;

FIG. 7B illustrates a re-arrangement of the centroids showing their corresponding divider phase option, in accordance with an example embodiment;

Figure 4A:
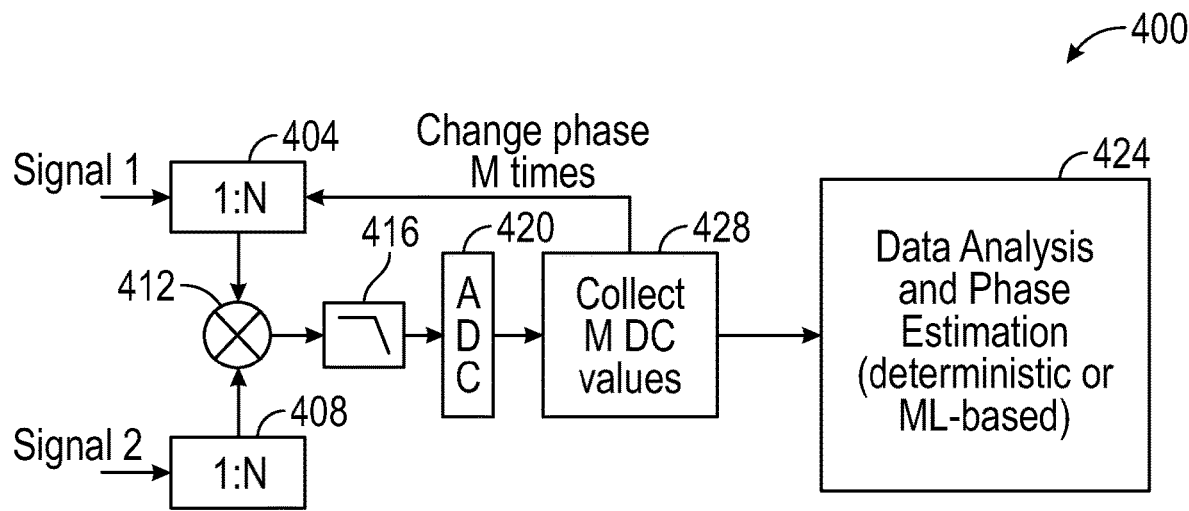
FIG. 4A illustrates a first example system architecture for phase estimation, in accordance with an example embodiment.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

In general, techniques are disclosed for estimating the phase difference between two high-frequency signals. The signals are assumed to be locked to a common reference signal (that is, the frequency of the signals is the same, but there is an unknown phase difference between them). Estimation of the phase difference/phase error enables the adjustment of a signal to a desired phase (such as 0 degrees or 90 degrees). It is worth noting that the difference is not perfectly static and could vary in time with temperature and noise. Here the intent is to estimate the 'average' phase difference over a period of time.

In one example embodiment, a 1:N divider is applied to each signal, the divided signals are multiplied (mixed), and a low-pass filter is applied to the mixed signal. The resulting direct current (DC) voltage of the filtered signal is converted to a digital representation by an analog-to-digital converter (ADC). In one example embodiment, the 1:N divider is disabled and then enabled multiple times (that is, the disable followed by enable is performed multiple times) to randomly exhibit a different output phase after almost all disable/enable sequences. For each time the divider is enabled, the output of the ADC is measured and recorded. The phase difference between the input signals is estimated by processing the set of measured ADC output values. In one example embodiment, the 1:N divider is programmed to deterministically select a specific phase. For each programmed divider state, the output of the ADC is measured and recorded. The phase difference between the input signals is estimated by processing the set of measured ADC output values. Note that there is a finite probability that the same phase could appear two times in a row; but it can be assumed that over a large set of disable/enable actions, the divider will show all possible phases.

FIG. 1 illustrates the theoretical principle of a conventional system 104 for mixer-based phase estimation. FIG. 1 is used as a reference design for phase estimation when ideal conditions are met both in terms of process/voltage/temperature (PVT), noise and ADC resolution. In the example of FIG. 1, two cosine signals, $A\cos(\omega t+\phi)$ and $A\cos(\omega t)$, with a phase difference j, are multiplied together by a mixer 108 to generate a high-frequency signal 112 with a DC component that relates to the phase difference. A low-pass filter 116 filters out the high-frequency component, leaving the DC component. Given the value of the output of the low-pass filter 116, the phase difference $\phi$ can be calculated.

FIG. 2 is a graph 250 that shows an expected amplitude for a range of values of the phase difference $\phi$ under ideal conditions. It is noted, however, that a single absolute DC value cannot provide accurate phase estimation due to non-idealities of the circuit, such as DC offset, varying signal amplitude, noise, and the like. In one example embodiment, a 1:N divider normalizes the amplitude of each clock, reducing the chance for accuracy degradation.

FIG. 3 illustrates the theoretical principle of a conventional system 204 for mixer-based phase synchronization with closed loop calibration 216. A variable time delay (not shown) for the high-frequency signal CLK2 ($A\cos(\omega t+\phi_{CLK2})$) enables the phase of the high-frequency signal CLK2 ($\phi_{CLK2}$) to be adjusted under the control of the close loop calibration unit 216. The close loop calibration unit 216 adjusts the phase of the CLK2 clock signal ($\phi_{CLK2}$) to synchronize the two sinusoidal signals and generate a peak output of the mixer 212, which is indicative of the phase difference.

FIG. 4A illustrates a first example system architecture 400 for phase estimation, in accordance with an example embodiment. Two phase-locked signals (Signal 1 and Signal 2) with the same frequency are divided by the 1:N dividers 404, 408, respectively. The outputs of the 1:N dividers 404, 408 are multiplied (mixed) by a mixer 412 and the output of the mixer 412 is filtered by a low-pass filter (LPF) 416. The DC values output by the LPF 416 are captured using an analog-to-digital converter (ADC) 420. A data collection process 428 changes the phase of one of the 1:N dividers 404, 408 (randomly or deterministically) up to M times and collects the DC values obtained from the ADC 420. (M is much greater than N (M>>N) to ensure that each available phase of the 1:N divider 404, 408 is selected at least once for the random-based embodiment. In one example embodiment, a k-means centroids estimation that indicates whether a representation of a sufficient count of samples has been attained is used. In accordance with another example embodiment, where the output phase of the divider is programmable deterministically, the data collection process changes the phase of one of the dividers 404, 408 only N times (one for each output phase option). A phase estimation process 424 (such as a statistical data analysis process; generally, deterministic or ML-based) computes the phase difference between the two signals (Signal 1 and Signal 2) based on the collected DC values by, for example, (1) performing a k-means clustering method on the collected DC samples to find N different centroid values (where N is the number of divider options as described above), (2) sorting and re-arranging the centroid values according to the divider phase options, (3) applying curve fitting, (4) finding the maximum value of the fitter curve, and (5) obtaining the estimated phase as the interpolated value between phase options where the maximum of the fitter curve is located. (Note: (1) phase-locked loops (PLLs) can be on separate, more complex, ICs (e.g. phased arrays) as appropriate, and (2) the 1:N dividers 404, 408 and mixer 412 can be implemented using readily-available components. Also, additional algorithms that enable jitter assessment may be utilized. In one non-limiting example embodiment, the phase estimation process 424 and the data collection process 428 are each implemented with software running on a corresponding digital processor of a data collection and analysis block.

Figure 4B:
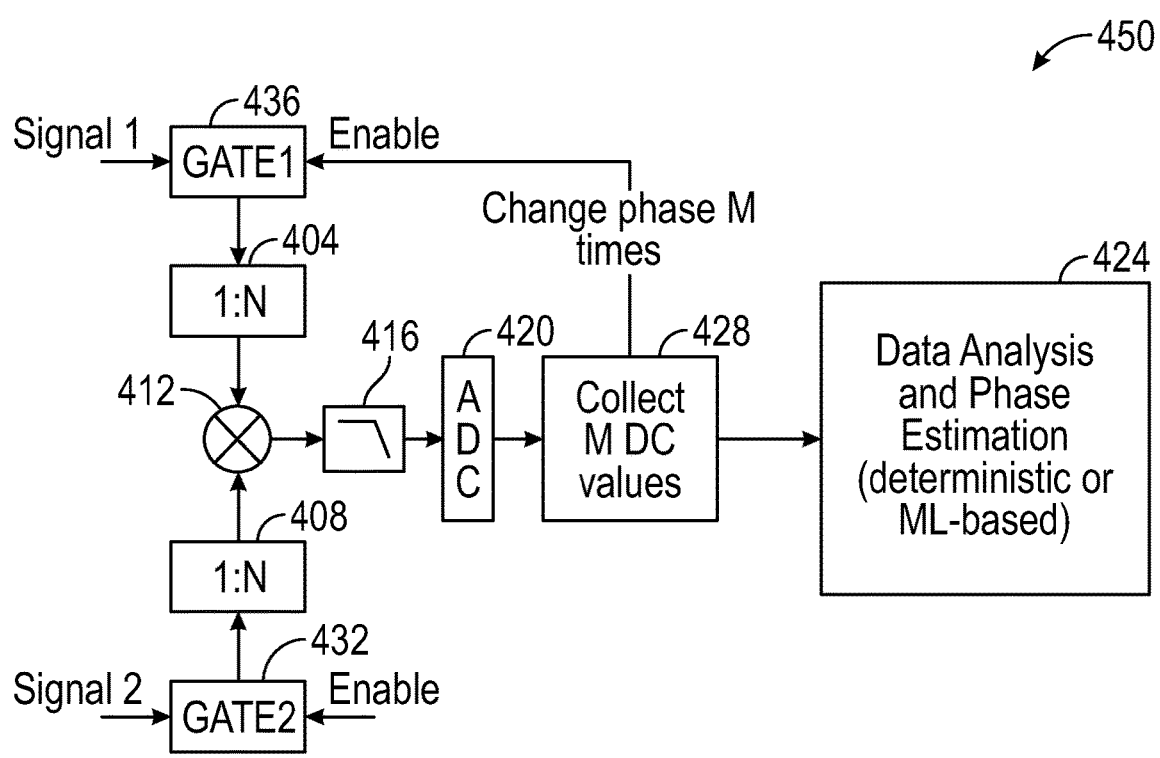
FIG. 4B illustrates a second example system architecture for phase estimation, in accordance with an example embodiment.

FIG. 4B illustrates a second example system architecture 450 for phase estimation, in accordance with an example embodiment. Two phase-locked signals have an unknown phase difference. The system architecture of FIG. 4B is similar to the system architecture of FIG. 4A, except a gate 436 (e.g., a switch) enables the input signal to the 1:N divider 404 to be selectively enabled. By toggling the enable signal to the gate 436 at different points in time, the phase of the output of the 1:N divider 404 is randomly changed. Signal 2 is connected to the 1:N divider 408 via a gate 432. In one or more embodiments, gate 432 is always enabled; it is included to provide circuit symmetry. The outputs of the 1:N dividers 404, 408 are multiplied (mixed) by the mixer 412 and the output of the mixer 412 is filtered by a low-pass filter (LPF) 416. The DC values output by the LPF 416 are captured using an analog-to-digital converter (ADC) 420. When the input signal to the 1:N divider 404 gets disabled and then re-enabled, the phase of the output of the 1:N divider 404 randomly changes (almost every time) to one of N possible values. The data collection process 428 toggles the enable signal to the gate 436 M times (M>>N) in order to generate all possible relative phases. The phase estimation process 424 computes the phase difference based on the collected DC data. As noted above, additional potential algorithms that enable jitter assessment and the like may be utilized.

Figure 4C:
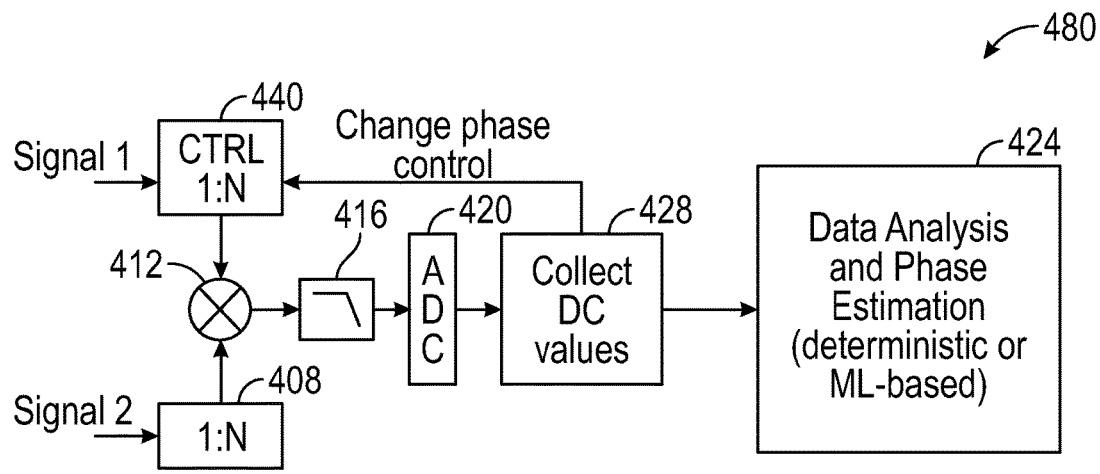
FIG. 4C illustrates a third example system architecture for phase estimation, in accordance with an example embodiment.

FIG. 4C illustrates a third example system architecture 480 for phase estimation, in accordance with an example embodiment. The system architecture 480 of FIG. 4C is based on the different relative phases between output signals of the 1:N dividers 408, 440. Two phase-locked signals have an unknown phase difference. The 1:N divider 440 is a programmable divider and the phase of the output of the 1:N divider 440 is changed deterministically via the change phase control signal. The outputs of the 1:N dividers 440, 408 are multiplied (mixed) by the mixer 412 and the output of the mixer 412 is filtered by a low-pass filter (LPF) 416. The DC values output by the LPF 416 are captured using an analog-to-digital converter (ADC) 420. The data collection process 428 changes the phase of the programmable 1:N divider 440 in order to generate most, if not all, possible divider phase values and collects the ADC output data corresponding to each phase setting. The phase estimation process 424 computes the phase difference based on the data collected by the data collection process 428. As noted above, additional potential algorithms that enable jitter assessment and the like may be utilized.

Figure 5A:
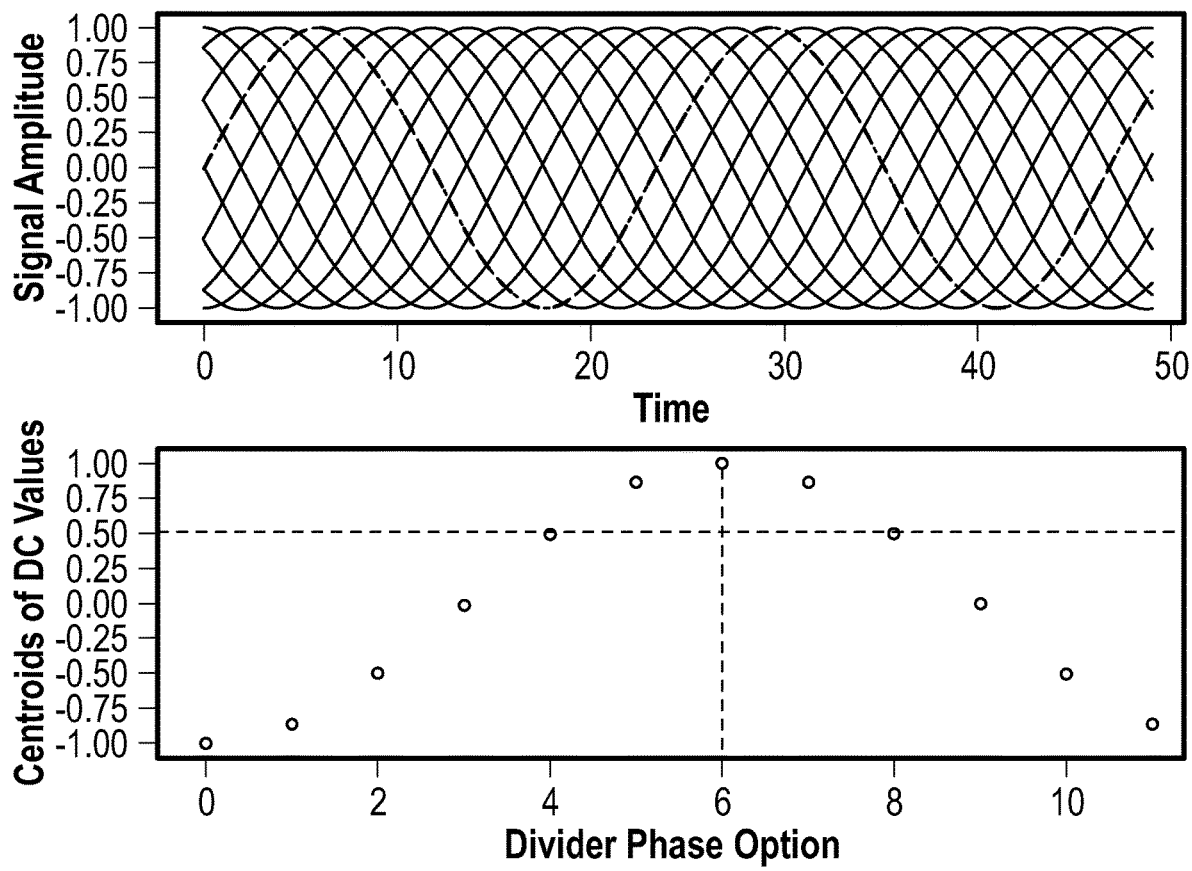
FIG. 5A illustrates example graphs of the output signal of a frequency divider showing the different phase options (top) and the centroids of the collected direct current (DC) values for the different divider phase options (bottom), in accordance with an example embodiment.

FIG. 5A illustrates example graphs of the output signal of the frequency divider 404 showing the different phase options (top) and the centroids of the collected DC values collected from the ADC 420 for the different divider phase options (bottom), in accordance with an example embodiment. The graphs correspond to a divider ratio of twelve and $\theta_s=0$ (where $\theta_s$ is the phase difference between Signal 1 and Signal 2). The top graph shows a fixed frequency-divided representation of Signal 2 (dashed line) compared with all divider options for Signal 1; thus, it shows the various outputs of the 1:N divider 404, 408, 440 that are available for selection. It is noted that the frequency of the input to the 1:N divider 404, 408, 440 is N times greater than the output. Thus, for each cycle of the output, there are N cycles of the input that can be selected for synchronization of the output signal. Depending on the input cycle that is selected for synchronization, the output of the 1:N divider 432 will have a different phase in comparison to other selections. As shown in the bottom graph, the centroids of DC values obtained by multiplying (mixing) the two sinusoidal signals (after the LPF 416 and the ADC 420) are symmetric around the maximum (peak) value; that is, the centroid values on either side of the peak are the same. This is emphasized by the horizontal dotted line. It is also worth noting that, in this case (zero phase difference), if a curve were to be fit along the centroid values, its peak would align perfectly with one of the divider options; this is emphasized by the vertical dotted line.

Figure 5B:
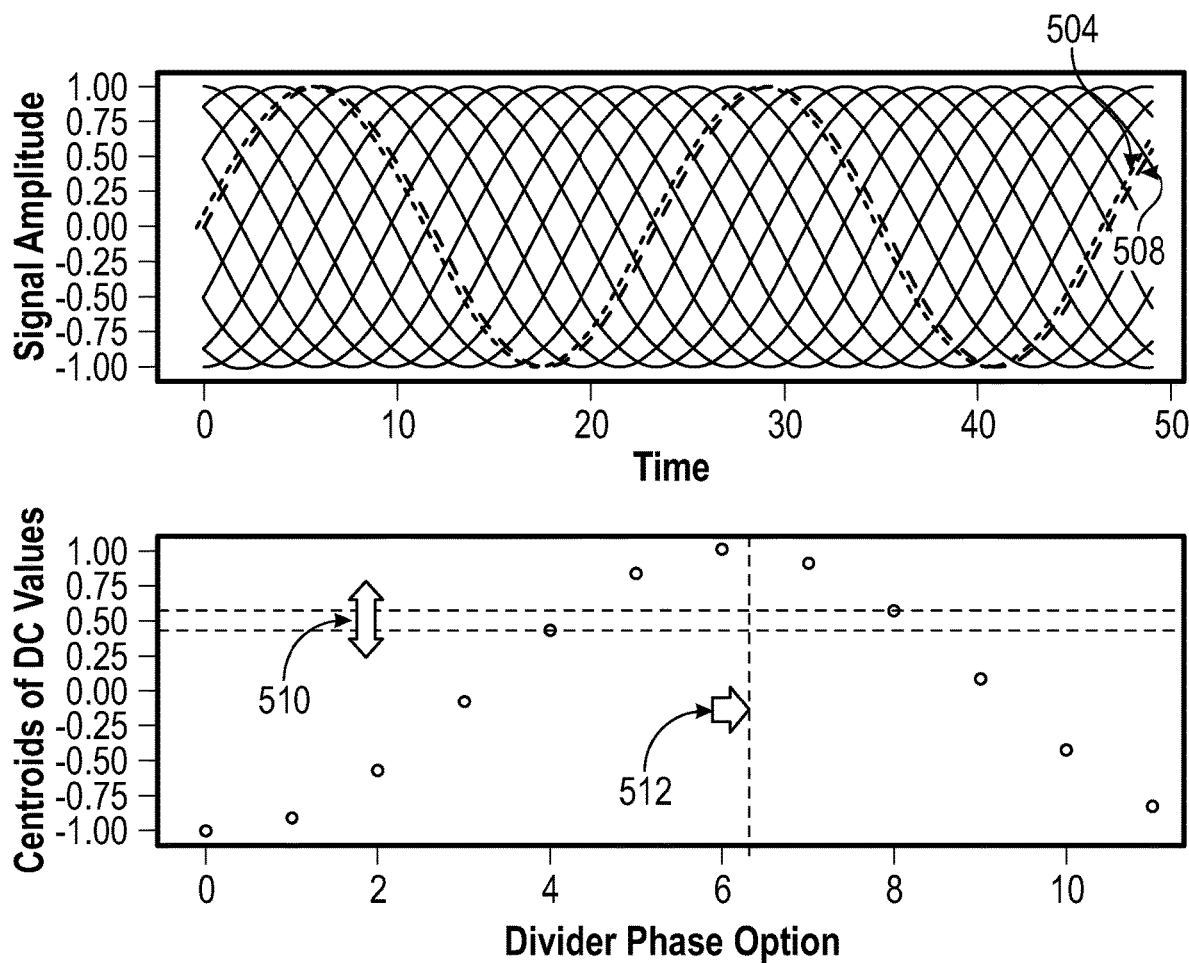
FIG. 5B illustrates example graphs of the output signal of a frequency divider showing its different phase options (top) and the centroids of the collected DC values for the different divider phase options (bottom), when a phase shift exists between Signal 1 and Signal 2 in the system architecture illustrated in FIGS. 4A and 4B, in accordance with an example embodiment.

FIG. 5B illustrates example graphs of the output signal of a frequency divider showing its different phase options (top) and the centroids of the collected DC values for the different divider phase options (bottom), when a phase shift exists between Signal 1 and Signal 2 in the system architecture illustrated in FIGS. 4A and 4B, in accordance with an example embodiment. The example graphs were produced with a divider ratio of twelve and $$\theta_s = \frac{\pi}{40};$$

thus, the sinusoidal signal is replicated twelve times with different phases in the top graph. The two sinusoidal signals 504 and 508 represent the two signals that are output from the 1:N dividers 404, 408, (or, similarly, represent the output of dividers 440 and 408). As illustrated, the two signals have a slight phase difference. Also, as shown in the bottom graph, the centroid values obtained by multiplying (mixing) the two sinusoidal signals exhibit substantially different centroid values than those in FIG. 5A even though a very small phase difference exists between the two sinusoidal signals 504, 508. Specifically, centroids that are at equidistant horizontal positions from the peak-valued centroid no longer have the same vertical axis value (as indicated by arrow 510) and, if a curve were to be fit along the centroids, its maximum value would no longer be at one of the centroid locations but shifted to the right (as indicated by arrow 512). While the center centroid value is almost as high as in FIG. 5A, the asymmetry is apparent even with such a small relative phase. For example, Cosine(0)=1 while Cosine($\pi$/40)=0.997, making the possibility of estimating such a small phase difference impossible when just based on the DC value. However, when introducing a divider shift, as in the embodiments of FIGS. 4A-4C, the difference in the values of cosine($\pi$/40+k*2*$\pi$/N) and cosine($\pi$/40-k*2*$\pi$/N) are much more significant allowing an accurate estimation of the phase difference. The difference is even more pronounced for non-sinusoidal signals. This amplified difference of the phase error exhibited by the centroid values improves the accuracy of the final phase estimation.

Figure 6A:
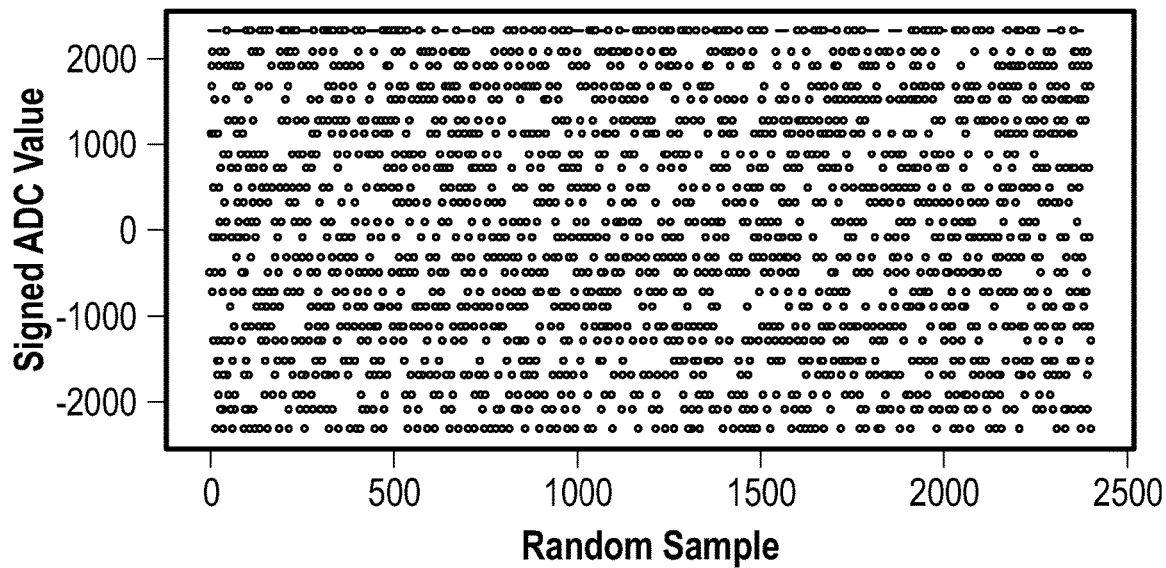
FIG. 6A illustrates a graph of 2,400 readings from an analog-to-digital converter (ADC), where the horizontal axis represents the ADC reading iteration number, in accordance with an example embodiment.

FIG. 6A illustrates a graph of 2400 readings from the ADC 420, per iteration, for multiple iterations, where the horizontal axis represents the ADC reading iteration number, in accordance with an example embodiment. The output phase of the 1:N divider 404 is randomly selected for each iteration (horizontal axis). Each signed ADC value (vertical axis) corresponds to one of the 24 available phases of the output of the 1:N divider.

Figure 6B:
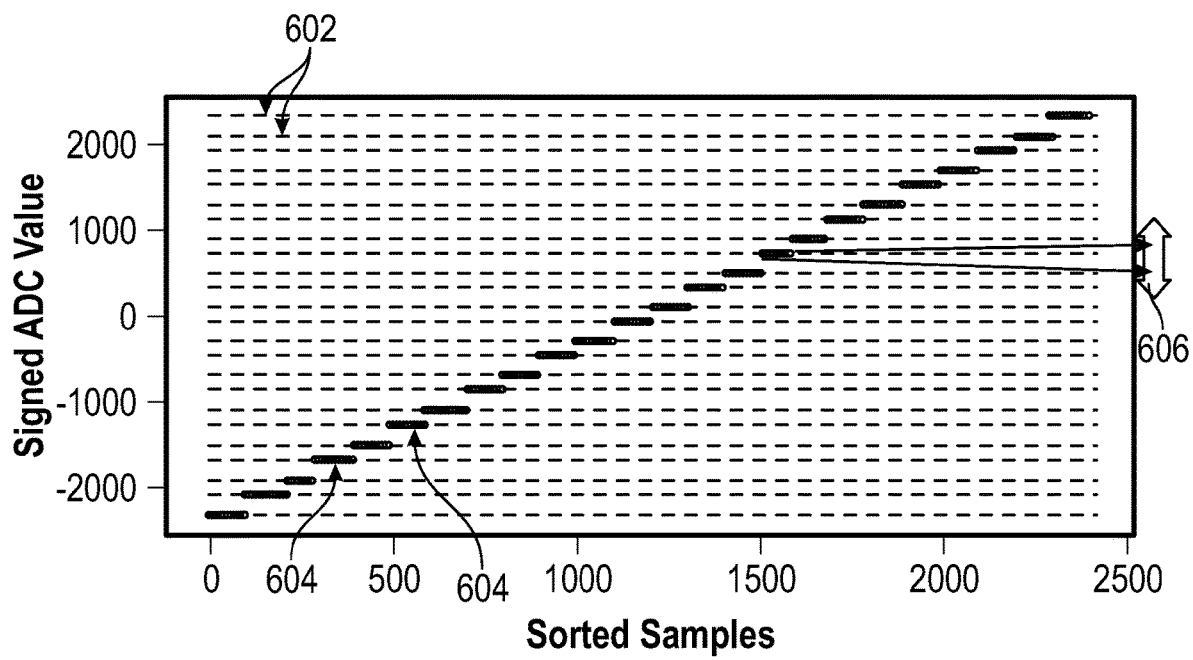
FIG. 6B illustrates a graph of the ADC readings from FIG. 6A after sorting by value and also showing the centroid values obtained from applying a k-means algorithm with Kc=24, in accordance with an example embodiment.

FIG. 6B illustrates a graph of the ADC readings of FIG. 6A after sorting by value (low to high) and also showing (as dotted lines) the centroid values obtained from applying a k-means algorithm with Kc=24, in accordance with an example embodiment. Twenty-four different groups of values 604 can be observed. The reading values withing these groups vary, but they are still distinguishable (non-overlapping) from the neighboring groups. K-means clustering is applied with a uniform distribution of Nc=24 k-means levels between minimum and maximum values. The obtained 24 centroid values are shown with dotted lines 602. In addition to finding the mean for each cluster, the K-means algorithm can also be leveraged to find the standard deviation of each cluster (606 is shown as an example). The jitter of the input Signal 1 and the quantization noise of the ADC 420 will both directly affect such standard deviation. In accordance with an example embodiment, the quantization noise of the ADC is determined by known methods and the jitter of Signal 1 is estimated from the standard deviation of the data clusters, obtained by the K-means algorithm.

FIG. 7A illustrates a graph of the 24 obtained centroid values (vertical axis) vs. a centroid index (horizontal axis) after sorting from low to high, in accordance with an example embodiment. FIG. 7B illustrates a re-arrangement of the centroids showing their corresponding divider phase option (horizontal axis), in accordance with an example embodiment. In one example embodiment, FIG. 7B is created using the algorithm below by deinterleaving the sorted values (illustrated by identifying subsequent centroid values as odd and even alternatively), concatenating the two vectors, and flipping one vector (values identified as even or odd). The resultant arrangement of centroid values can be mapped to the divider phase options in the horizontal axis. In one example embodiment, the following algorithm is used to generate a re-arrangement of the centroids (showing their corresponding divider phase option):

Order the correlation values
   Sort centroids[Nc] low-to-high
   Allocate an array [Nc]
   array[0:Nc/2]=centroids[::2]
   array[Nc/2:]=flip(centroids[1::2])

In one example embodiment, line fitting techniques are used on the reordered centroid values that are mapped to the divider phase options. FIG. 7B illustrates the result of fitting a line along each of the vectors of centroid values. In one example embodiment, a peak (maxima) value 702 is found at the intersection of the two fitted lines. In one example embodiment, the phase difference between Signal 1 and Signal 2 is found by finding the phase value 704 that corresponds to the found peak value.

It should be noted that different divider implementations and their associated non-idealities will result in different output signal waveforms which will, in turn, result in different requirements for the line(s) or curve(s) that may best fit the ordered centroid values along the corresponding divider phase options. In one example embodiment, a curve fitting technique is used to fit a single-cycle sinusoidal along the ordered centroid values, and the phase difference between Signal 1 and Signal 2 is found by finding the phase value that corresponds to the found maxima of the sinusoid.

Note that examples of data analysis processes for phase estimation, in accordance with example embodiments, are discussed below with respect to FIGS. 11A and 11B.

Figure 8:
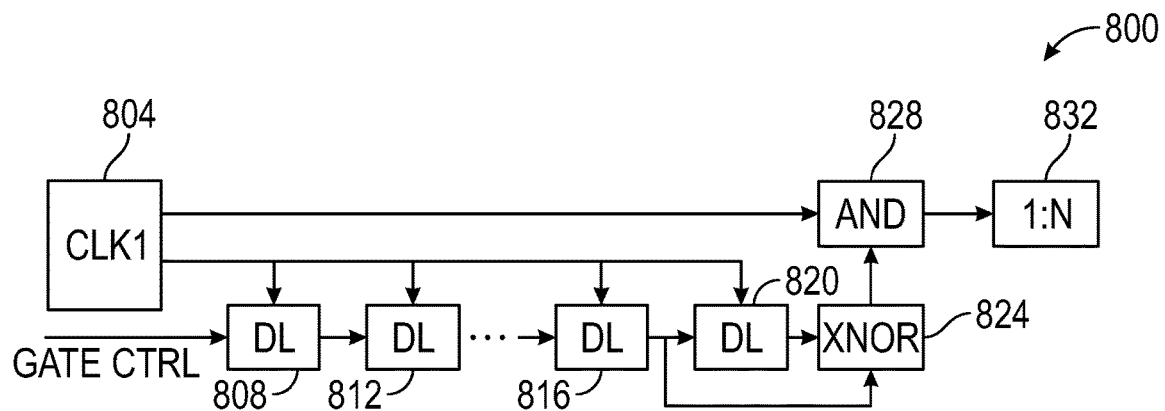
FIG. 8 illustrates an example of a divider with a controllable output phase, in accordance with an example embodiment.

FIG. 8 illustrates a diagram of a divider circuit 800 with a controllable output phase, in accordance with an aspect of the invention. A clock 804 is gated with a single clock pulse (derived from the clock 804) by an AND gate 828 and the gated clock is divided by a 1:N divider 832. Chained D Latches (DL) 808, 812, . . . , 816, 820 are used to ensure reliable gating and an output of XNOR gate 824 generates the single clock pulse, that is, a '0' for a single cycle of the clock 804, every time the GATE CTRL signal changes state.

Figure 9:
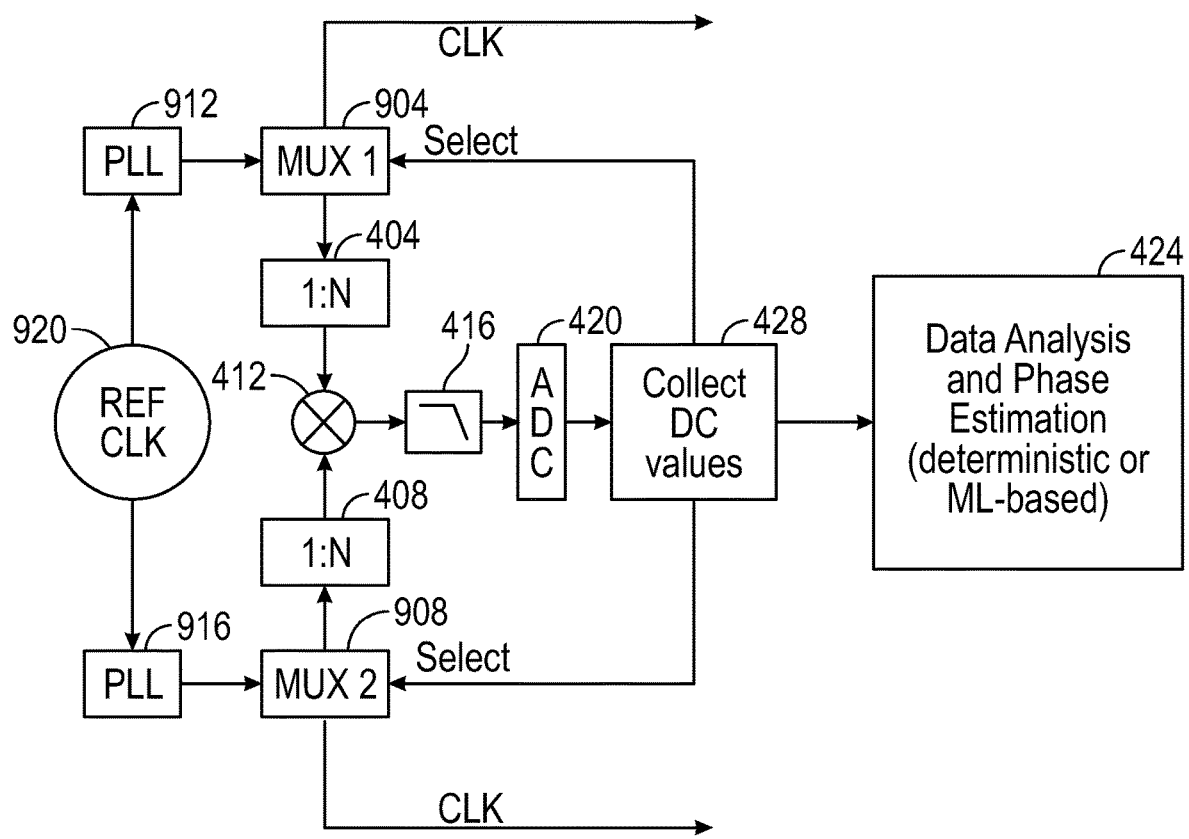
FIG. 9 illustrates a non-limiting exemplary implementation of the phase estimation system of FIG. 4A, in accordance with an example embodiment.

FIG. 9 illustrates a non-limiting exemplary implementation of the phase estimation system 400 of FIG. 4A, in accordance with an example embodiment. Two phase-locked loop-based clock generators 912, 916 are synchronized with a common reference clock 920. Multiplexers 904, 908 couple the clock outputs of the PLL-based clock generators 912, 916 to the 1:N dividers 404, 408, in addition to external circuitry that utilizes the synchronized clocks for external processing. The outputs of the 1:N dividers 404, 408 are multiplied (mixed) by the mixer 412 and the output of the mixer 412 is filtered by a low-pass filter (LPF) 416. The DC values output by the LPF 416 are captured using an analog-to-digital converter (ADC) 420. The data collection process 428 toggles the select inputs of the multiplexers 904, 908 in order to randomly generate all possible relative phases between them and computes the phase estimation. It is noted that the PLL-based clock generators 912, 916 can be implemented on separate, more complex integrated circuits (ICs) (such as phased arrays), and that the 1:N dividers 404, 408 and multiplexers 904, 908 are, in one example embodiment, readily-available components. It is noted that this embodiment is less expensive and easier to produce, and preserves the power of the clocks as it is using a multiplexer for both manipulating the dividers phase and also maintaining the output power of the clocks, although the output of the clocks is blocked during the calibration process.

Figure 10:
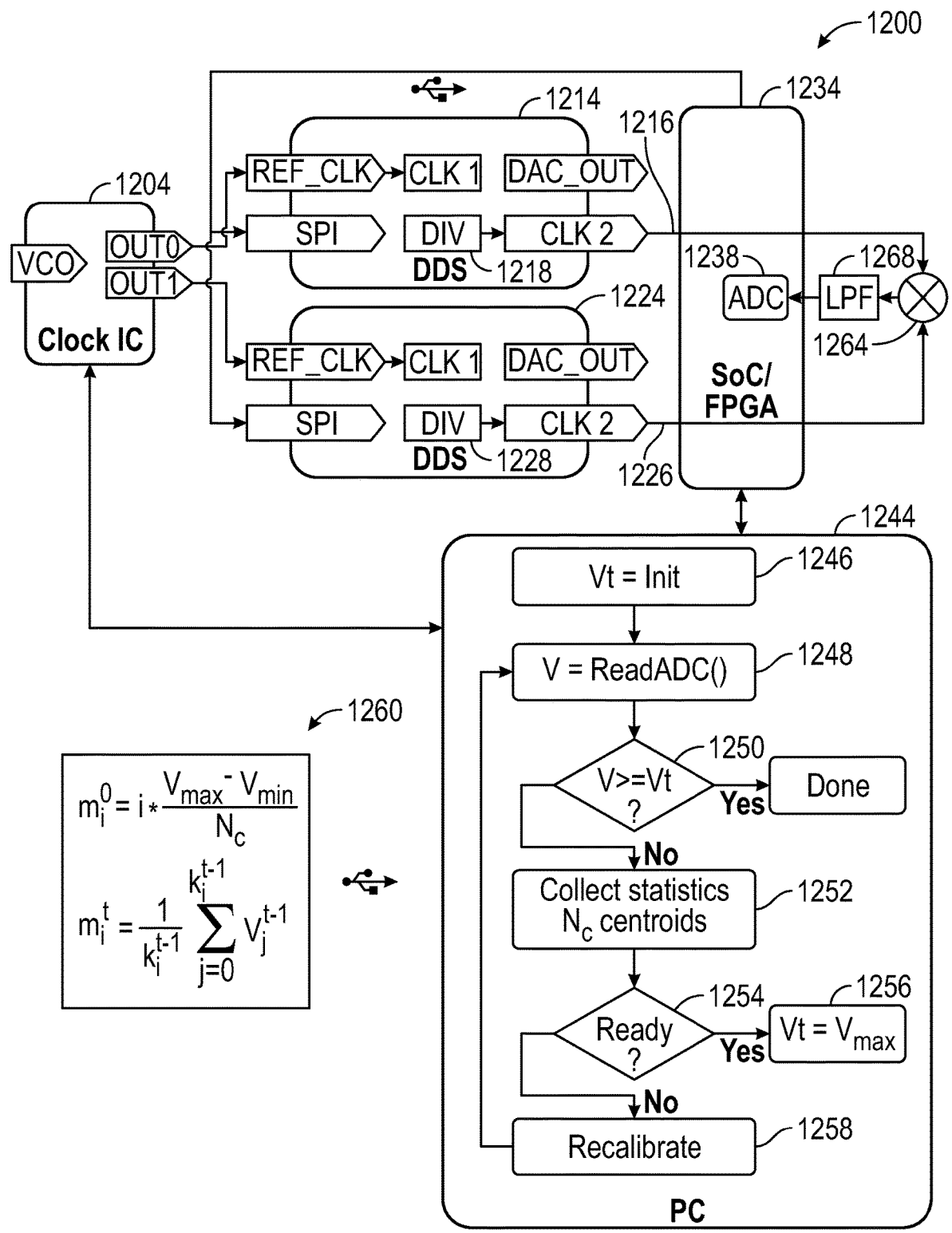
FIG. 10 illustrates a system for clock phase difference estimation and alignment between two direct digital synthesis (DDS) devices, in accordance with an example embodiment.

FIG. 10 illustrates a system 1200 for clock phase difference estimation and alignment between two DDS devices, in accordance with an example embodiment. The centroid calculation is performed using a k-means algorithm, with default initialization of $N_c$ centroids $m_i^0$, where i is centroid index. Every iteration, each reading is reassigned to a closest centroid. Each centroid i in time t has $k_i^{t-1}$ readings assigned for $m_i^t$ calculation.

In one example embodiment, a voltage-controlled oscillator 1204 generates a reference clock for DDS 1214 and DDS 1224. In the example embodiment of FIG. 10, VCO 1204 generates two outputs, OUT0 and OUT1, having the same frequency. The outputs OUT0 and OUT1 are provided to DDS 1214 and DDS 1224, respectively. Divider 1218 of DDS 1214 and divider 1228 of DDS 1224 divide the respective OUT0 and OUT1 signals received from the VCO 1204 to produce clock 1216 and clock 1226, respectively. A mixer 1264 multiplies (mixes) clock 1216 and clock 1226, and the resulting signal is filtered by low-pass filter 1268. The filtered signal is then converted to a digital value by ADC 1238. In one example embodiment, the ADC 1238 is one component of a System-on-Chip (SoC)/Field Programmable Gate Array (FPGA) 1234 that also performs the data collection and analysis of the data collection process 428 and the phase estimation process 424. The FPGA 1234 also implements algorithm 1244, which controls the VCO 1204, the DDS 1214, and the DDS 1224.

In one example embodiment, algorithm 1244 sets Vt to an appropriate initialization value Inn (operation 1246) and variable V is set to the value read from the ADC 1238 (operation 1248). A check is performed to determine if variable V is greater than or equal to Vt (decision block 1250). If variable V is greater than or equal to Vt (YES branch of decision block 1250), the algorithm 1244 ends; otherwise (NO branch of decision block 1250), the statistics are collected, the centroids are determined and the statistics are analyzed (operation 1252). (In one example embodiment, the centroids are determined based on the k-means equations 1260.) A check is performed to determine if clock 1216 and clock 1226 are synchronized (decision block 1254). If clock 1216 and clock 1226 are not synchronized (NO branch of decision block 1254), the algorithm 1244 performs recalibration (operation 1258) and the algorithm proceeds with operation 1248; otherwise (YES branch of decision block 1254), Vt is set to Vmax (operation 1256).

Figure 11A:
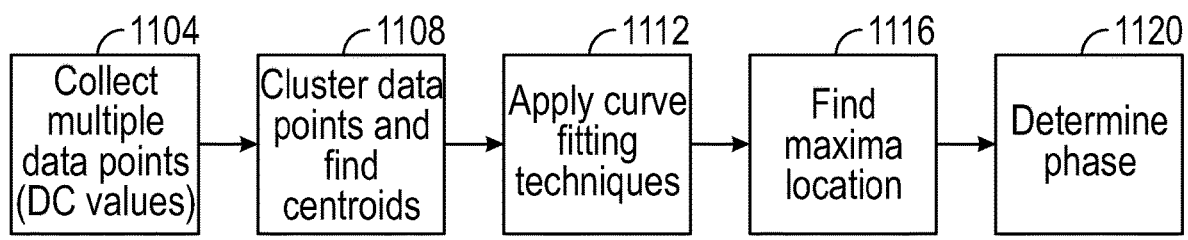
FIG. 11A illustrates a flowchart of a first example data analysis process for phase estimation, in accordance with an example embodiment.

FIG. 11A illustrates a flowchart of a first example data analysis process for phase estimation, in accordance with an example embodiment. The phase estimation process (such as a statistical data analysis process) computes the phase difference between the two signals (Signal 1 and Signal 2) based on the collected DC values. In one example embodiment, the DC values are collected (operation 1104) and a k-means clustering method is performed on the collected DC samples to find N different centroid values (where N is the number of divider options, as described above) (operation 1108). The centroid values are sorted and re-arranged according to the divider phase options and a curve fitting technique is applied to the re-arranged centroids (operation 1112). The maximum value of the fitter curve is determined (operation 1116) and the estimated phase is determined as the interpolated value between phase options where the maximum of the fitter curve is located (operation 1120).

Figure 11B:
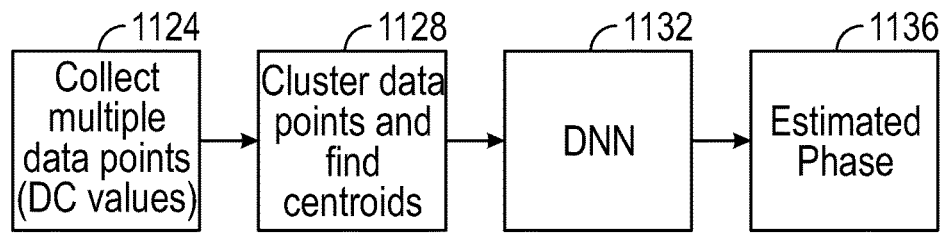
FIG. 11B illustrates a flowchart of a second example data analysis process for phase estimation, in accordance with an example embodiment.

FIG. 11B illustrates a flowchart of a second example data analysis process for phase estimation, in accordance with an example embodiment. In one example embodiment, the DC values are collected (operation 1124) and a k-means clustering method is performed on the collected DC samples to find N different centroid values (where N is the number of divider options, as described above) (operation 1128). The centroid values are processed by a deep neural network (DNN) (operation 1132). The estimated phase is determined (operation 1136). Note that the DNN can be trained to estimate the phase from the input using known training techniques such as training on a human-annotated training corpus or on input-phase data obtained from another estimation/calculation technique. In one example embodiment, samples of clusters of centroids (refer to FIGS. 6A and 6B) are generated while processing training examples of two input signals and are appropriately labeled with the resulting estimated phase. The labeled samples are used to train the DNN. Once trained, a cluster of centroids are generated for two given input signals, the generated cluster is processed by the DNN and a phase estimation is provided by the DNN based on the training samples. DNNs can be implemented in software on a general-purpose computer or a high-speed computer using GPUs, in hardware, using hardware acceleration, etc.

Given the teachings herein, the skilled artisan can implement embodiments as depicted in the figures. For example, digital switches, gates, multiplexers, latches, and the like can be synthesized in logic using techniques such as discussed with respect to FIG. 13; in addition, mixers, filters, and the like can be implemented in analog circuitry using known techniques based on the teachings herein.

Given the discussion thus far, it will be appreciated that, in general terms, an exemplary method, according to an aspect of the invention, includes the operations of, for M iterations, toggling a phase control signal impacting an output of a given one of a plurality of 1:N dividers 404, 408 and collecting, from an analog-to-digital converter 420, a direct current value derived from a multiplication of the outputs of the plurality of 1:N dividers 404, 408; generating a sorted set of the collected direct current values by clustering the direct current values into N centroids using a clustering algorithm; deinterleaving sampling to two vectors; concatenating the two vectors; and flipping one of the two vectors.

In one example embodiment, the clustering algorithm comprises K-means.

In one aspect, a method for performing phase estimation comprises obtaining a sorted set of collected direct current values generated from a plurality of relative phases between outputs of two 1:N frequency dividers 404, 440, 408; and estimating a phase difference between two source signals for the 1:N frequency dividers 404, 440, 408.

In one example embodiment, multiple samples of relative phases are acquired to extend a statistical basis.

In one example embodiment, the estimating of the phase difference comprises using a machine learning model trained to estimate the phase difference based on the sorted set of collected direct current values.

In one example embodiment, the estimating of the phase difference comprises using a function to represent a transformation and the phase difference is estimated using a peak location based on the transformation.

In one example embodiment, the estimating of the phase difference comprises using a second order polynomial function to represent a transformation and the phase is estimated using a peak location based on the transformation.

In one aspect, a system for estimating a phase difference between two signals comprises a first 1:N frequency divider 404, 440, an input of the first 1:N frequency divider 404, 440 configured to be coupled to one of the two signals; a second 1:N frequency divider 408, an input of the second 1:N frequency divider 408 configured to be coupled to another of the two signals; a mixer 412 comprising two inputs, each input coupled to an output of one of the first and second 1:N frequency dividers 404, 440, 408; a low-pass filter (LPF) 416, an input of the low-pass filter 416 coupled to an output of the mixer 412; an analog-to-digital converter (ADC) 420, an input of the analog-to-digital converter 420 coupled to an output of the low-pass filter 416; a data collection and analysis block 424, 428 that repeatedly changes a phase of an output of the first 1:N divider 404, 440 and collects a set of digitized data generated by the ADC 420 and that estimates the phase difference between the two signals based on the set of digitized data.

The data collection and analysis block, the phase estimation process 424 and the data collection process 428 may be implemented as a dedicated digital circuit, a field-programmable gate array (FGPA), an algorithm running in software on a generic digital processor, analog circuitry, or any combination of the above.

In one example embodiment, a given one of the first and the second 1:N dividers 404, 440, 408 is configured to deterministically select a phase of a signal output of the given one of the first and the second 1:N dividers 404, 440, 408 via a phase control signal. In one non-limiting example embodiment, the phase control signal is generated by the data collection process 428.

In one example embodiment, the system further comprises a gating device 436, an output of the gating device 436 being coupled to an input of a given one of the first and the second 1:N dividers 404, 440, 408 and the gating device 436 being configured to randomly select a phase of a signal output of the given one of the first and the second 1:N dividers 404, 440, 408 via a phase control signal.

In one example embodiment, the data collection and analysis block 424, 428 is configured to, for M iterations, cause toggling of a phase control signal to the gating device 436 and impacting an output of the first 1:N frequency divider 404 and collecting, from the analog-to-digital converter 420, a direct current value derived from a multiplication of the outputs of the first and second 1:N frequency dividers 404, 408; generate a sorted set of the collected direct current values by clustering the direct current values into N centroids using a clustering algorithm; deinterleave sampling to two vectors; concatenate the two vectors; and flip one of the two vectors.

In one example embodiment, the clustering algorithm comprises K-means.

In one example embodiment, the system further comprises a clock circuit that generates the two signals, wherein the two signals are clock signals.

In one example embodiment, the data collection and analysis block 424, 428 is configured to obtain the digitized data as a sorted set of collected direct current values generated from a plurality of relative phases between the outputs of the first and second 1:N frequency dividers 404, 440, 408; and estimate the phase difference between the two signals for the 1:N frequency dividers 404, 440, 408, based on the sorted set of collected direct current values.

In one example embodiment, the data collection and analysis block 424, 428 is configured to estimate the phase difference by using a machine learning model trained to estimate the phase difference based on the sorted set of collected direct current values.

In one example embodiment, the data collection and analysis block 424, 428 is configured to estimate the phase difference by using a function to represent a transformation and estimating the phase difference using a peak location based on the transformation. In one example embodiment, the function is a sinusoidal function.

In one example embodiment, the data collection and analysis block 424, 428 is configured to estimate the phase difference by using a second order polynomial function to represent a transformation and estimating the phase difference using a peak location based on the transformation.

In one example embodiment, the data collection and analysis block comprises a phase estimation process 424 and a data collection process 428.

Computing Device Useful in Connection with Exemplary Design Process Used in Semiconductor Design, Manufacture, and/or Test Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 2100 contains an example of an environment for the execution of at least some of the computer code involved in performing the inventive methods, such as a data collection and analysis 2200 and/or software for semiconductor design, manufacture, and/or test as described below. In addition to block 2200, computing environment 2100 includes, for example, computer 2101, wide area network (WAN) 2102, end user device (EUD) 2103, remote server 2104, public cloud 2105, and private cloud 2106. In this embodiment, computer 2101 includes processor set 2110 (including processing circuitry 2120 and cache 2121), communication fabric 2111, volatile memory 2112, persistent storage 2113 (including operating system 2122 and block 2200, as identified above), peripheral device set 2114 (including user interface (UI) device set 2123, storage 2124, and Internet of Things (IoT) sensor set 2125), and network module 2115. Remote server 2104 includes remote database 2130. Public cloud 2105 includes gateway 2140, cloud orchestration module 2141, host physical machine set 2142, virtual machine set 2143, and container set 2144.

Figure 12:
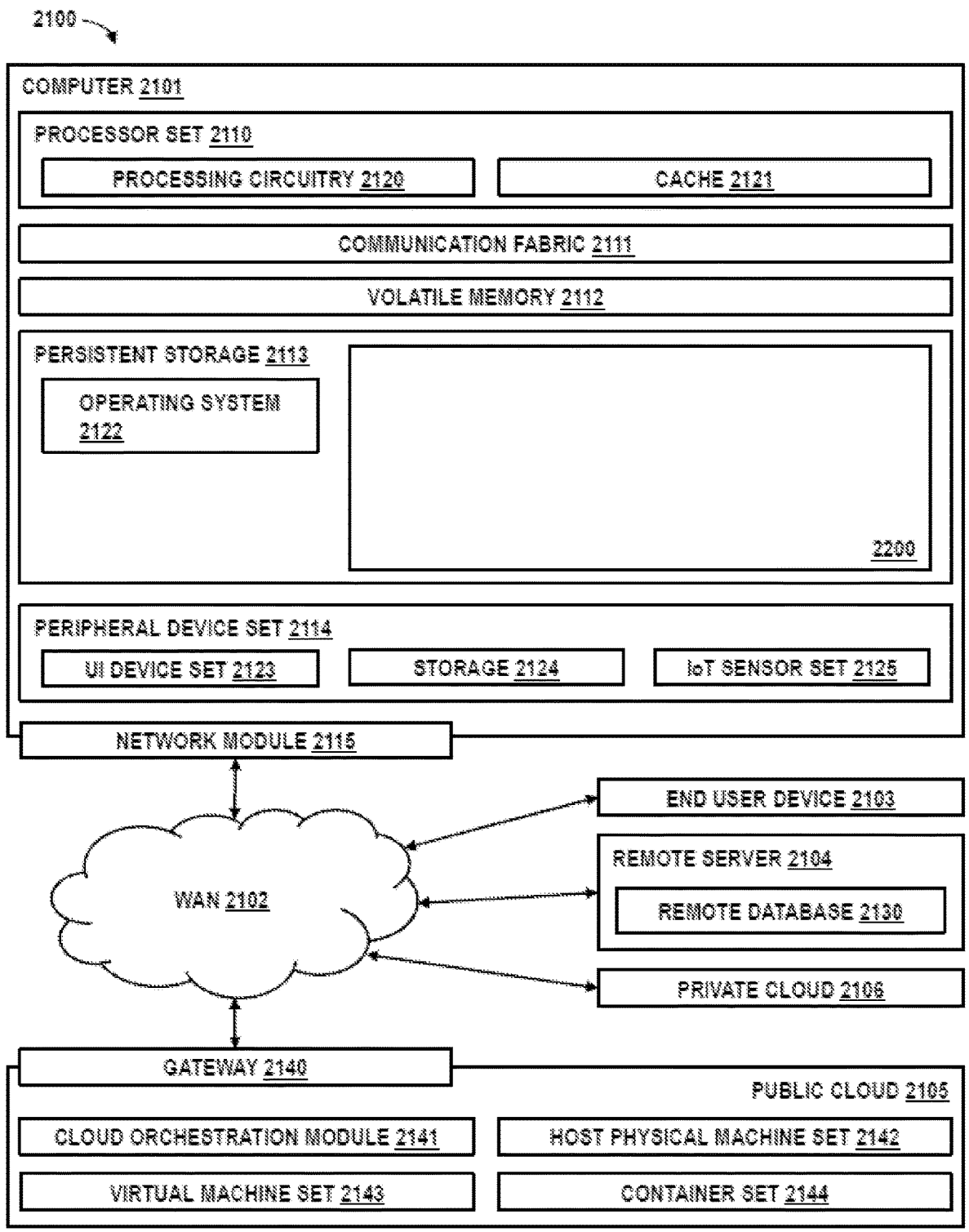
FIG. 12 depicts a computing environment that can be used in connection with the design process of FIG. 13.

COMPUTER 2101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 2130. As is well understood in the art of computer technology, and depending upon the technology, performance of a computer-implemented method may be distributed among multiple computers and/or between multiple locations. On the other hand, in this presentation of computing environment 2100, detailed discussion is focused on a single computer, specifically computer 2101, to keep the presentation as simple as possible. Computer 2101 may be located in a cloud, even though it is not shown in a cloud in FIG. 12. On the other hand, computer 2101 is not required to be in a cloud except to any extent as may be affirmatively indicated.

PROCESSOR SET 2110 includes one, or more, computer processors of any type now known or to be developed in the future. Processing circuitry 2120 may be distributed over multiple packages, for example, multiple, coordinated integrated circuit chips. Processing circuitry 2120 may implement multiple processor threads and/or multiple processor cores. Cache 2121 is memory that is located in the processor chip package(s) and is typically used for data or code that should be available for rapid access by the threads or cores running on processor set 2110. Cache memories are typically organized into multiple levels depending upon relative proximity to the processing circuitry. Alternatively, some, or all, of the cache for the processor set may be located "off chip." In some computing environments, processor set 2110 may be designed for working with qubits and performing quantum computing.

Computer readable program instructions are typically loaded onto computer 2101 to cause a series of operational steps to be performed by processor set 2110 of computer 2101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 2121 and the other storage media discussed below. The program instructions, and associated data, are accessed by processor set 2110 to control and direct performance of the inventive methods. In computing environment 2100, at least some of the instructions for performing the inventive methods may be stored in block 2200 in persistent storage 2113.

COMMUNICATION FABRIC 2111 is the signal conduction path that allows the various components of computer 2101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 2112 is any type of volatile memory now known or to be developed in the future. Examples include dynamic type random access memory (RAM) or static type RAM. Typically, volatile memory 2112 is characterized by random access, but this is not required unless affirmatively indicated. In computer 2101, the volatile memory 2112 is located in a single package and is internal to computer 2101, but, alternatively or additionally, the volatile memory may be distributed over multiple packages and/or located externally with respect to computer 2101.

PERSISTENT STORAGE 2113 is any form of non-volatile storage for computers that is now known or to be developed in the future. The non-volatility of this storage means that the stored data is maintained regardless of whether power is being supplied to computer 2101 and/or directly to persistent storage 2113. Persistent storage 2113 may be a read only memory (ROM), but typically at least a portion of the persistent storage allows writing of data, deletion of data and re-writing of data. Some familiar forms of persistent storage include magnetic disks and solid state storage devices. Operating system 2122 may take several forms, such as various known proprietary operating systems or open source Portable Operating System Interface-type operating systems that employ a kernel. The code included in block 2200 typically includes at least some of the computer code involved in performing the inventive methods.

PERIPHERAL DEVICE SET 2114 includes the set of peripheral devices of computer 2101. Data communication connections between the peripheral devices and the other components of computer 2101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 2123 may include components such as a display screen, speaker, microphone, wearable devices (such as goggles and smart watches), keyboard, mouse, printer, touchpad, game controllers, and haptic devices. Storage 2124 is external storage, such as an external hard drive, or insertable storage, such as an SD card. Storage 2124 may be persistent and/or volatile. In some embodiments, storage 2124 may take the form of a quantum computing storage device for storing data in the form of qubits. In embodiments where computer 2101 is required to have a large amount of storage (for example, where computer 2101 locally stores and manages a large database) then this storage may be provided by peripheral storage devices designed for storing very large amounts of data, such as a storage area network (SAN) that is shared by multiple, geographically distributed computers. IoT sensor set 2125 is made up of sensors that can be used in Internet of Things applications. For example, one sensor may be a thermometer and another sensor may be a motion detector.

NETWORK MODULE 2115 is the collection of computer software, hardware, and firmware that allows computer 2101 to communicate with other computers through WAN 2102. Network module 2115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 2115 are performed on the same physical hardware device. In other embodiments (for example, embodiments that utilize software-defined networking (SDN)), the control functions and the forwarding functions of network module 2115 are performed on physically separate devices, such that the control functions manage several different network hardware devices. Computer readable program instructions for performing the inventive methods can typically be downloaded to computer 2101 from an external computer or external storage device through a network adapter card or network interface included in network module 2115.

WAN 2102 is any wide area network (for example, the internet) capable of communicating computer data over non-local distances by any technology for communicating computer data, now known or to be developed in the future. In some embodiments, the WAN 2102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 2103 is any computer system that is used and controlled by an end user (for example, a customer of an enterprise that operates computer 2101), and may take any of the forms discussed above in connection with computer 2101. EUD 2103 typically receives helpful and useful data from the operations of computer 2101. For example, in a hypothetical case where computer 2101 is designed to provide a recommendation to an end user, this recommendation would typically be communicated from network module 2115 of computer 2101 through WAN 2102 to EUD 2103. In this way, EUD 2103 can display, or otherwise present, the recommendation to an end user. In some embodiments, EUD 2103 may be a client device, such as thin client, heavy client, mainframe computer, desktop computer and so on.

REMOTE SERVER 2104 is any computer system that serves at least some data and/or functionality to computer 2101. Remote server 2104 may be controlled and used by the same entity that operates computer 2101. Remote server 2104 represents the machine(s) that collect and store helpful and useful data for use by other computers, such as computer 2101. For example, in a hypothetical case where computer 2101 is designed and programmed to provide a recommendation based on historical data, then this historical data may be provided to computer 2101 from remote database 2130 of remote server 2104.

PUBLIC CLOUD 2105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 2105 is performed by the computer hardware and/or software of cloud orchestration module 2141. The computing resources provided by public cloud 2105 are typically implemented by virtual computing environments that run on various computers making up the computers of host physical machine set 2142, which is the universe of physical computers in and/or available to public cloud 2105. The virtual computing environments (VCEs) typically take the form of virtual machines from virtual machine set 2143 and/or containers from container set 2144. It is understood that these VCEs may be stored as images and may be transferred among and between the various physical machine hosts, either as images or after instantiation of the VCE. Cloud orchestration module 2141 manages the transfer and storage of images, deploys new instantiations of VCEs and manages active instantiations of VCE deployments. Gateway 2140 is the collection of computer software, hardware, and firmware that allows public cloud 2105 to communicate through WAN 2102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 2106 is similar to public cloud 2105, except that the computing resources are only available for use by a single enterprise. While private cloud 2106 is depicted as being in communication with WAN 2102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 2105 and private cloud 2106 are both part of a larger hybrid cloud.

Exemplary Design Process Used in Semiconductor Design, Manufacture, and/or Test

Figure 13:
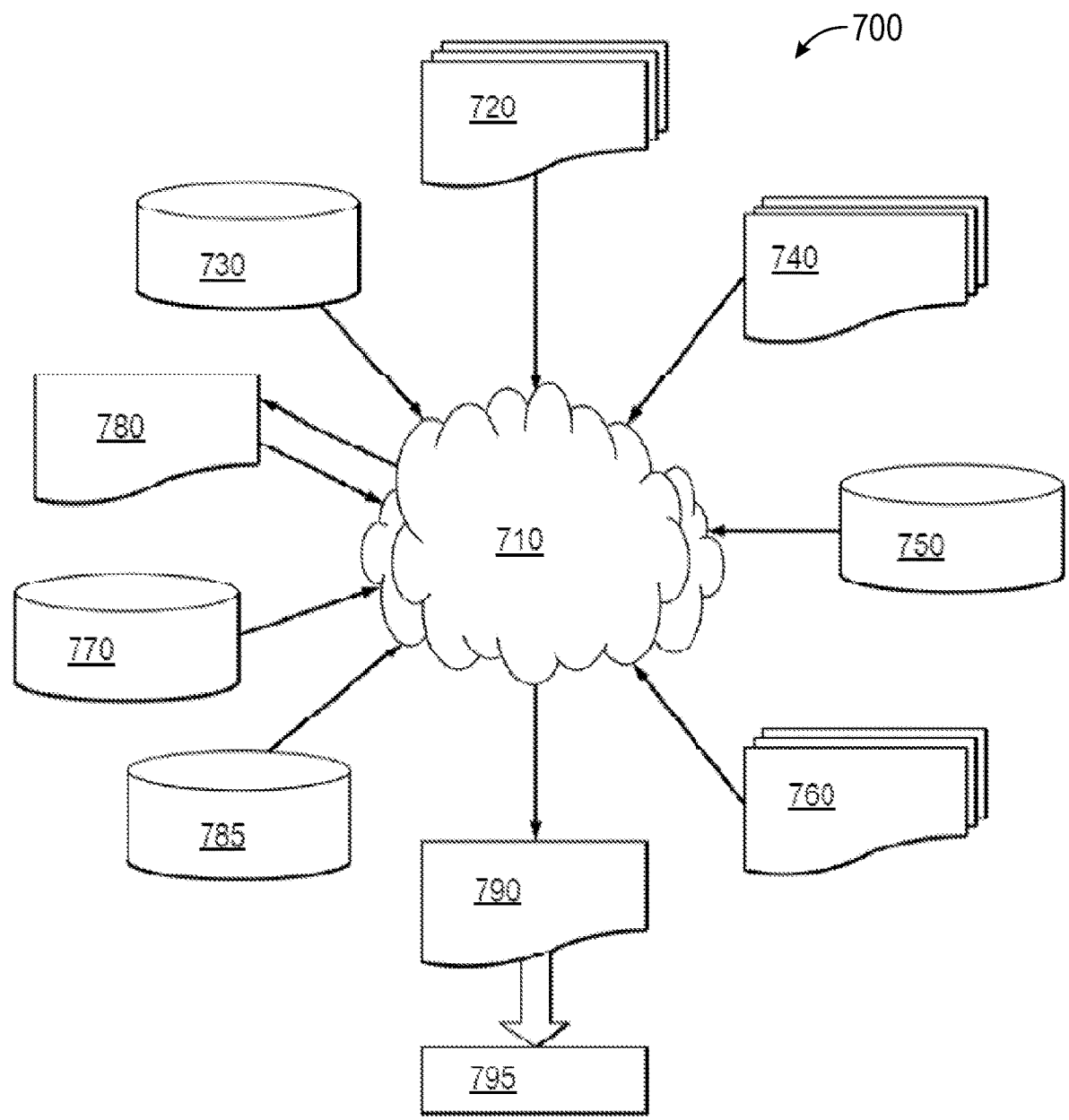
FIG. 13 is a flow diagram of a design process used in semiconductor design, manufacture, and/or test.

One or more embodiments integrate the characterizing and simulating techniques herein with semiconductor integrated circuit design simulation, test, layout, and/or manufacture. In this regard, FIG. 13 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved latch tree synthesis can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for estimating a phase difference between two signals comprising:
    a first 1:N frequency divider, an input of the first 1:N frequency divider configured to be coupled to one of the two signals;
    a second 1:N frequency divider, an input of the second 1:N frequency divider configured to be coupled to another of the two signals;
    a mixer comprising two inputs, each input coupled to an output of one of the first and second 1:N frequency dividers;
    a low-pass filter (LPF), an input of the low-pass filter coupled to an output of the mixer;
    an analog-to-digital converter (ADC), an input of the analog-to-digital converter coupled to an output of the low-pass filter;
    a data collection and analysis block that repeatedly changes a phase of an output of the first 1:N divider, collects a set of digitized data generated by the analog-to-digital converter (ADC), stores the set of digitized data generated by the analog-to-digital converter (ADC) and estimates the phase difference between the two signals based on the stored set of digitized data generated by the analog-to-digital converter (ADC).

2. The system of claim 1, wherein a given one of the first and the second 1:N dividers is configured to deterministically select a phase of a signal output of the given one of the first and the second 1:N dividers via a phase control signal.

3. The system of claim 1, the system further comprising a gating device, an output of the gating device being coupled to an input of a given one of the first and the second 1:N dividers and the gating device being configured to randomly select a phase of a signal output of the given one of the first and the second 1:N dividers via a phase control signal.

4. The system of claim 1, wherein the data collection and analysis block is configured to:
    for M iterations, cause toggling of a phase control signal to the gating device and impacting an output of the first 1:N frequency divider and collecting, from the analog-to-digital converter, a direct current value derived from a multiplication of the outputs of the first and second 1:N frequency dividers;
    generate a sorted set of the collected direct current values by clustering the direct current values into N centroids using a clustering algorithm;
    deinterleave sampling to two vectors;
    concatenate the two vectors; and
    flip one of the two vectors.

5. The system of claim 4, wherein the clustering algorithm comprises K-means.

6. The system of claim 1, the system further comprising a clock circuit that generates the two signals, wherein the two signals are clock signals.

7. The system of claim 1, wherein the data collection and analysis block is configured to:
    obtain the digitized data as a sorted set of collected direct current values generated from a plurality of relative phases between the outputs of the first and second 1:N frequency dividers; and
    estimate the phase difference between the two signals for the 1:N frequency dividers based on the sorted set of collected direct current values generated from the plurality of relative phases.

8. The system of claim 7, wherein the data collection and analysis block is configured to estimate the phase difference by using a machine learning model trained to estimate the phase difference based on the sorted set of collected direct current values.

9. The system of claim 1, wherein the data collection and analysis block is configured to estimate the phase difference by using a function to represent a transformation and estimating the phase difference using a peak location based on the transformation.

10. The system of claim 1, wherein the data collection and analysis block is configured to estimate the phase difference by using a second order polynomial function to represent a transformation and estimating the phase difference using a peak location based on the transformation.

11. The system of claim 1, wherein the data collection and analysis block comprises a phase estimation process and a data collection process.

12. A method comprising:
    for M iterations, toggling a phase control signal impacting an output of a given one of a plurality of 1:N dividers and collecting, from an analog-to-digital converter, a direct current value derived from a multiplication of the outputs of the plurality of 1:N dividers;
    generating a sorted set of the collected direct current values by clustering the direct current values into N centroids using a clustering algorithm;
    deinterleaving sampling to two vectors;
    concatenating the two vectors; and
    flipping one of the two vectors.

13. The method of claim 12, wherein the clustering algorithm comprises K-means.

14. A method for performing phase estimation, the method comprising:
    obtaining a sorted set of collected direct current values generated from a plurality of relative phases between outputs of two 1:N frequency dividers;
    storing the sorted set of collected direct current values; and
    estimating a phase difference between two source signals for the 1:N frequency dividers based on the stored sorted set of collected direct current values.

15. The method of claim 14, wherein multiple samples of relative phases are acquired to extend a statistical basis.

16. The method of claim 14, wherein the estimating of the phase difference comprises using a machine learning model trained to estimate the phase difference based on the sorted set of collected direct current values.

17. The method of claim 14, wherein the estimating of the phase difference comprises using a function to represent a transformation and wherein the phase difference is estimated using a peak location based on the transformation.

18. The method of claim 14, wherein the estimating of the phase difference comprises using a second order polynomial function to represent a transformation and wherein the phase is estimated using a peak location based on the transformation.

* * * * *